(12) United States Patent
Burdette et al.

(10) Patent No.: US 11,993,548 B2
(45) Date of Patent: May 28, 2024

(54) MINIMIZATION OF CHEMICAL VAPOR INFILTRATION TOOLING HOLE LENGTH THROUGH WINDOWS

(71) Applicant: Raytheon Technologies Corporation, Farmington, CT (US)

(72) Inventors: Alyson T. Burdette, Gilbertsville, PA (US); Jon Erik Sobanski, Glastonbury, CT (US); Kenneth Petroski, Anaheim, CA (US); Ying She, Rocky Hill, CT (US); Kathryn S. Read, Marlborough, CT (US)

(73) Assignee: RTX Corporation, Farmington, CT (US)

( * ) Notice: Subject to any disclaimer, the term of this patent is extended or adjusted under 35 U.S.C. 154(b) by 0 days.

(21) Appl. No.: 17/957,624

(22) Filed: Sep. 30, 2022

(65) Prior Publication Data
US 2024/0109815 A1 Apr. 4, 2024

(51) Int. Cl.
*B05D 3/02* (2006.01)
*C04B 41/45* (2006.01)

(52) U.S. Cl.
CPC ........ *C04B 41/457* (2013.01); *C04B 41/4531* (2013.01); *C04B 2235/614* (2013.01)

(58) Field of Classification Search
CPC .. C04B 41/457; C04B 41/4531; C04B 41/614
See application file for complete search history.

(56) References Cited

U.S. PATENT DOCUMENTS 5,065,696 A * 11/1991 Greenberg ............ C03C 17/001
65/182.1
5,209,525 A 5/1993 Ito
(Continued)

FOREIGN PATENT DOCUMENTS

CN 110261256 A 9/2019
CN 110978569 A 4/2020
(Continued)

OTHER PUBLICATIONS

Extended European Search Report for EP Application No. 23199553.1, dated Mar. 1, 2024, 7 pages.
(Continued)

*Primary Examiner* — Joseph A Miller, Jr.
(74) *Attorney, Agent, or Firm* — Kinney & Lange, P.A.

(57) ABSTRACT

A tooling assembly suitable for use in infiltrating a fibrous preform comprises an outer tooling fixture with a plurality of outer sidewalls defining an inner volume, each of the plurality of outer sidewalls having an outer wall thickness, and a window extending through the outer wall thickness of at least one outer sidewall of the plurality of sidewalls. The tooling assembly further comprises an inner tooling fixture positioned within the inner volume of the outer tooling fixture, the inner tooling having a plurality of inner sidewalls, each of the plurality of inner sidewalls having an inner wall thickness, and a plurality of holes extending through the inner wall thickness of at least one inner sidewall of the plurality of inner sidewalls. The at least one outer sidewall is positioned adjacent the at least one inner sidewall such that the window overlaps with at least a subset of the plurality of holes in the at least one inner sidewall.

18 Claims, 2 Drawing Sheets

(56) References Cited

U.S. PATENT DOCUMENTS

| | | | |
|---|---|---|---|
| 5,480,678 A | 1/1996 | Rudolph et al. | |
| 6,669,988 B2 | 12/2003 | Daws et al. | |
| 7,691,443 B2 | 4/2010 | Rudolph et al. | |
| 10,906,205 B2 | 2/2021 | Thibaud et al. | |
| 2008/0314966 A1* | 12/2008 | Elston | B65D 81/263 |
| | | | 229/120 |
| 2009/0095221 A1 | 4/2009 | Tam et al. | |
| 2014/0363327 A1 | 12/2014 | Holcomb | |
| 2016/0196956 A1* | 7/2016 | Zhang | H01J 37/3244 |
| | | | 204/298.07 |
| 2017/0036400 A1 | 2/2017 | Loeffler et al. | |
| 2019/0322004 A1 | 10/2019 | White et al. | |
| 2021/0053122 A1 | 2/2021 | Socha et al. | |
| 2021/0101841 A1 | 4/2021 | Ritchey | |
| 2021/0381384 A1 | 12/2021 | Barker | |

FOREIGN PATENT DOCUMENTS

| | | |
|---|---|---|
| CN | 115008791 A | 9/2022 |
| EP | 3805424 A1 | 4/2021 |

OTHER PUBLICATIONS

Extended European Search Report for EP Application No. 23199556.4, dated Mar. 1, 2024, 7 pages.
Extended European Search Report for EP Application No. 23201057.9, dated Feb. 15, 2024, 6 pages.

* cited by examiner

MINIMIZATION OF CHEMICAL VAPOR INFILTRATION TOOLING HOLE LENGTH THROUGH WINDOWS

BACKGROUND

The present invention relates to chemical vapor infiltration (CVI), and more particularly to improved tooling for CVI.

Ceramic matrix composite (CMC) parts are widely fabricated by densifying preforms made from woven fabrics or oriented/braided fiber tows. CVI is a commonly used densification technique practiced in industry. To keep the preforms in a rigid form and maintain proper shape and geometry, perforated tooling can be used to hold the preforms during the initial densification cycle(s). Holes in the tooling allow vaporous precursors to infiltrate into the preform for the deposition of a ceramic matrix. Tooling for simple preform can be designed with uniform hole lengths. When used with complexly-shaped preforms, such as turbine airfoils, such holes can be too long to allow vaporous precursors to sufficiently infiltrate the preform at certain locations. Thus, a need exists for improved tooling.

SUMMARY

A tooling assembly suitable for use in infiltrating a fibrous preform comprises an outer tooling fixture with a plurality of outer sidewalls defining an inner volume, each of the plurality of outer sidewalls having an outer wall thickness, and a window extending through the outer wall thickness of at least one outer sidewall of the plurality of sidewalls. The tooling assembly further comprises an inner tooling fixture positioned within the inner volume of the outer tooling fixture, the inner tooling having a plurality of inner sidewalls, each of the plurality of inner sidewalls having an inner wall thickness, and a plurality of holes extending through the inner wall thickness of at least one inner sidewall of the plurality of inner sidewalls. The at least one outer sidewall is positioned adjacent the at least one inner sidewall such that the window overlaps with at least a subset of the plurality of holes in the at least one inner sidewall.

A method of arranging a fibrous preform in a tooling assembly for chemical vapor infiltration (CVI) comprises securing the fibrous preform within an inner tooling fixture, the inner tooling fixture having a plurality of inner sidewalls, each of the plurality of inner sidewalls having an inner wall thickness, and a plurality of holes extending through the inner wall thickness of at least one inner sidewall of the plurality of inner sidewalls. The method further comprises placing the inner tooling fixture within an internal volume of an outer tooling fixture, the outer tooling fixture having a plurality of outer sidewalls defining the inner volume, each of the plurality of outer sidewalls having an outer wall thickness, and a window extending through the outer wall thickness of at least one outer sidewall of the plurality of sidewalls. Placing the inner tooling fixture within the internal volume of the outer tooling fixture comprises orienting the inner tooling fixture such that the window overlaps with at least a subset of the plurality of holes.

A tooling assembly suitable for use in infiltrating a fibrous preform comprises an outer tooling fixture having a plurality of outer sidewalls defining an inner volume, each of the plurality of outer sidewalls having an outer wall thickness, and a window extending through the outer wall thickness of at least one outer sidewall of the plurality of sidewalls. The tooling assembly further comprises an inner tooling fixture positioned within the inner volume of the outer tooling fixture, the inner tooling fixture having a plurality of inner sidewalls, each of the plurality of inner sidewalls having an inner wall thickness, and a plurality of holes extending through the inner wall thickness of at least one inner sidewall of the plurality of inner sidewalls. The at least one outer sidewall is positioned adjacent the at least one inner sidewall such that the window entirely overlaps with each hole of the plurality of holes in the at least one inner sidewall.

Figure 1:
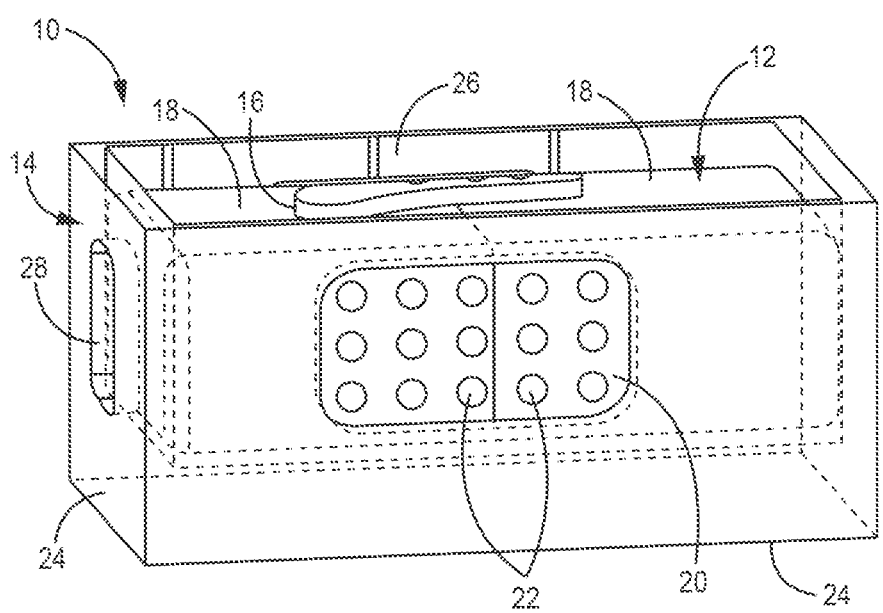
FIG. 1 is a perspective view of a tooling assembly with a fibrous preform mounted therein.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

This disclosure presents a CVI tooling assembly with varied hole lengths. More specifically, the disclosed assembly can include inner tooling with holes having a uniform diameter, and outer tooling with relatively wider windows aligned with one or more of the inner tooling holes. This provides a flow path for vaporous precursors with an increased diameter relative to traditional designs where outer tooling may include individual holes aligned with respective holes of the inner tooling, both holes having substantially similar diameters.

FIG. 1 is a perspective view of tooling assembly 10. Tooling assembly 10 includes inner tooling fixture 12 and outer tooling fixture 14. Inner tooling fixture 12 surrounds and helps maintain the shape of preform 16, which, in the embodiment depicted in FIG. 1, is arranged as an airfoil (e.g., of a blade or vane), and can include an inner diameter (ID) and/or outer diameter (OD) platform in some embodiments. In an alternative embodiment, fibrous preform 16 can have an alternative (e.g., planar) geometry. Preform 16 can be formed, in an exemplary embodiment, from bundled tows of silicon carbide (SiC) fibers arranged in one of various two or three-dimensional woven architectures such as plain, harness (e.g., 3, 5, 8, etc.), twill, braid, or non-symmetric to name a few non-limiting examples. In an alternative embodiment, preform 16 can be formed from non-woven (e.g., chopped, felted, etc.) fibers.

Inner tooling fixture 12 can include multiple pieces 18 assembled around preform 16 and held together using clamps, male-female interfaces, interference fit, etc. Inner tooling fixture 12 can be a unitary piece in an alternative embodiment. In the embodiment of FIG. 1, the assembled pieces 18 form a rectangular prism, with multiple sidewalls 20 (i.e., "inner sidewalls"). Inner tooling fixture 12 further includes infiltration holes 22 generally aligned with preform 16 to permit the flow of vaporous precursors within the reactor/furnace to reach preform 16 during CVI. Holes 22 can be disposed in arrays (i.e., of rows and columns), including various polygonal arrays, discrete clusters, or in other patterned arrangements on multiple sidewalls 20.

Outer tooling fixture 14 is configured to receive inner tooling fixture 12, and therefore, is similarly constructed as a rectangular prism with multiple sidewalls 24 (i.e., "outer sidewalls") defining internal volume 26 in which inner tooling fixture 12 can be placed. Inner volume 26 can be completely enclosed by sidewalls 24, even though outer tooling fixture 14 is shown in FIG. 1 without its top/upper sidewall 24. Each of inner tooling fixture 12 and outer tooling fixture 14 can have other cuboidal or non-cuboidal complementary geometries in an alternative embodiment. The flat bottom sidewall 24 of outer tooling fixture 14 facilitates stable placement of outer tooling fixture 14 on a benchtop and/or inside the CVI reactor. Outer tooling fixture 14 can include multiple cutouts, or windows 28 in one or more sidewalls 24, placing the external environment in flow communication with internal volume 26. Windows 28 can at least partially, if not entirely overlap with all or a subset of holes 22 in inner tooling fixture 12. Accordingly, when inner tooling fixture 12 is contained within outer tooling fixture 14, window(s) 28 aligned with holes 22 can place the external environment in flow communication with preform 16.

One or both inner tooling fixture 12 and outer tooling fixture 14 can be formed from graphite in an exemplary embodiment. Portions of inner tooling fixture 12 and/or outer tooling fixture 14 can additionally and/or alternatively be formed from refractory metal alloys, non-graphitic forms of carbon (e.g., carbon-carbon composites) and/or ceramics (e.g., SiC). Such features can include, for example, locating pins.

Figure 2:
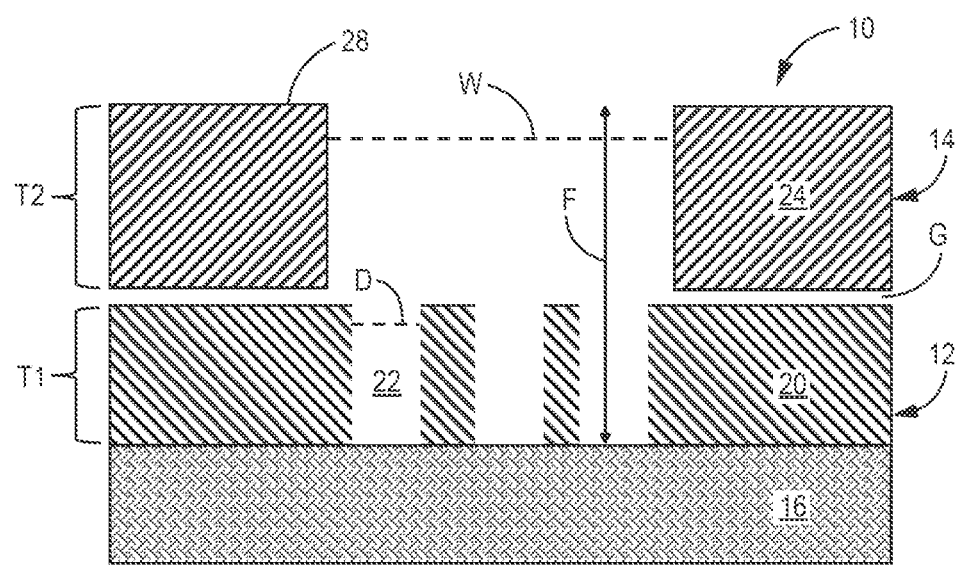
FIG. 2 is a simplified cross-sectional view of inner and outer components of the tooling assembly and the fibrous preform.

FIG. 2 is a simplified cross-sectional illustration of tooling assembly 10, showing a portion of each of outer tooling fixture 14, inner tooling fixture 12, and preform 16. As shown in FIG. 2, window 28 of outer tooling fixture 14 is aligned with a plurality of holes 22 of inner tooling fixture 12. Gap G can exist between outer tooling fixture 14 and inner tooling fixture 12, depending on the dimensions of inner tooling fixture 12 and inner volume 26 (FIG. 1) of outer tooling fixture 14. In an alternative embodiment, inner tooling fixture 12 can be flush with outer tooling fixture 14 along one or more sidewalls 20 such that no gap exists. Sidewall 20 of inner tooling fixture 12 can have a first thickness T1, and sidewall 24 of outer tooling fixture 14 can have a second thickness T2. In one embodiment, thickness T1 and/or T2 can range from 0.25 in (6.35 mm) to 1.0 in (25.4 mm), and more specifically, between 0.5 in (12.7 mm) to 0.75 in (19.05 mm). Thicknesses less than 0.25 in and/or greater than 1.0 in are contemplated in alterative embodiments. As shown in FIG. 2, holes 22 can have a generally cylindrical cross-sectional geometry with a length equivalent to first thickness T1, and a diameter D. Other cross-sectional geometries are contemplated herein. Window 28 can have a rectangular geometry, as is shown in FIG. 1, with an area defined by a length L (not labeled) and a width W. In an alternative embodiment, one or more of windows 28 can have an alternative geometry, such as circular, elliptical, square, etc.

Flow path F represents the distance of the direct path from the external environment and the surface of preform 16 and is defined by the combined dimensions of first thickness T1, second distance T2, and gap G, if present. Due to the combination of a window 28 and hole 22, flow path F is not constrained to a uniform diameter along its entire length, rather, it has a wider portion (i.e., width W) and a narrower portion (i.e., diameter D). Such arrangement promotes improved mass transfer of vaporous precursor into and/or out of the preform during CVI. The particular hole diameters D and window width W and/or length L selected can be based on, for example, a desired relationship between L and D, where L is flow path F and D is the combination of W (or L) and D, as depicted in FIG. 2.

To use tooling assembly 10 for CVI, preform 16 is secured by/within inner tooling fixture 12. As discussed above, this can include clamping of multiple pieces 18 together. Inner tooling fixture 12 with preform 16 can then be placed within inner volume 26 of outer tooling fixture 14 in an orientation that best fits inner volume 26 and/or to best align holes 22 and windows 28. Any of sidewalls 20 can be flush with or gapped apart from sidewalls 24. Once inner tooling fixture 12 is sufficiently secured by outer tooling fixture 14, tooling assembly 10 can be placed in the CVI reactor.

In addition to increasing access by vaporous precursors to preform 16, windows 28 can provide easy access to inner tooling fixture 12 when enclosed within outer tooling fixture 14. Such access can be desirable, for example, to reposition inner tooling fixture 12. Windows 28 can further extend the life cycle tooling assembly 10 by mitigating the deposit of reactants on and within holes 22 which eventually prevents vaporous precursors from transporting to said holes 22.

Tooling assembly 10 can be used when infiltrating preform 16, via CVI, to deposit interface coatings (e.g., layers of BN, SiC, Si-doped BN, etc.) and/or to form a matrix (e.g., SiC) to create a CMC part. Such CMC parts can be incorporated into aerospace, maritime, or industrial equipment, to name a few, non-limiting examples.

Discussion of Possible Embodiments

The following are non-exclusive descriptions of possible embodiments of the present invention.

A tooling assembly suitable for use in infiltrating a fibrous preform comprises an outer tooling fixture with a plurality of outer sidewalls defining an inner volume, each of the plurality of outer sidewalls having an outer wall thickness, and a window extending through the outer wall thickness of at least one outer sidewall of the plurality of sidewalls. The tooling assembly further comprises an inner tooling fixture positioned within the inner volume of the outer tooling fixture, the inner tooling having a plurality of inner sidewalls, each of the plurality of inner sidewalls having an inner wall thickness, and a plurality of holes extending through the inner wall thickness of at least one inner sidewall of the plurality of inner sidewalls. The at least one outer sidewall is positioned adjacent the at least one inner sidewall such that the window overlaps with at least a subset of the plurality of holes in the at least one inner sidewall.

The tooling assembly of the preceding paragraph can optionally include, additionally and/or alternatively, any one or more of the following features, configurations and/or additional components:

In the above tooling assembly, the outer tooling fixture can be formed from one of graphite and non-graphitic carbon.

In any of the above tooling assemblies, the inner tooling fixture can be formed from one of graphite and non-graphitic carbon.

In any of the above tooling assemblies, the outer tooling fixture can include a window extending through the thickness of at least two outer sidewalls of the plurality of sidewalls.

In any of the above tooling assemblies, the inner tooling fixture can include a plurality of holes through the thickness of at least two inner sidewalls of the plurality of sidewalls.

In any of the above tooling assemblies, the outer wall thickness and the inner wall thickness can combine to define a length of a straight flow path through the window and one hole of the subset of holes.

In any of the above tooling assemblies, a gap can exist between the at least one outer sidewall and the at least one inner sidewall, and the gap can further define the length of the flow path.

In any of the above tooling assemblies, the one hole of the subset of holes can have a diameter, and the window can have a width, greater than the diameter.

In any of the above tooling assemblies, wherein the flow path can be wider at the window than at the one hole.

In any of the above tooling assemblies, the inner tooling fixture can be configured to retain a fibrous preform within the plurality of inner sidewalls.

In any of the above tooling assemblies, each of the inner tooling fixture and the outer tooling fixture can have a cuboidal geometry.

A method of arranging a fibrous preform in a tooling assembly for chemical vapor infiltration (CVI) comprises securing the fibrous preform within an inner tooling fixture, the inner tooling fixture having a plurality of inner sidewalls, each of the plurality of inner sidewalls having an inner wall thickness, and a plurality of holes extending through the inner wall thickness of at least one inner sidewall of the plurality of inner sidewalls. The method further comprises placing the inner tooling fixture within an internal volume of an outer tooling fixture, the outer tooling fixture having a plurality of outer sidewalls defining the inner volume, each of the plurality of outer sidewalls having an outer wall thickness, and a window extending through the outer wall thickness of at least one outer sidewall of the plurality of sidewalls. Placing the inner tooling fixture within the internal volume of the outer tooling fixture comprises orienting the inner tooling fixture such that the window overlaps with at least a subset of the plurality of holes.

The method of the preceding paragraph can optionally include, additionally and/or alternatively, any one or more of the following features, configurations and/or additional components:

The above method can further include placing the outer tooling fixture and inner tooling fixture within a CVI reactor.

In any of the above methods, securing the fibrous preform within the inner tooling fixture can include clamping together multiple pieces of the inner tooling fixture around the fibrous preform.

In any of the above methods, placing the inner tooling fixture within the internal volume of the outer tooling fixture can include making the at least one inner sidewall flush with the at least one outer sidewall.

In any of the above methods, placing the inner tooling fixture within the internal volume of the outer tooling fixture can include leaving a gap between the at least one inner sidewall and the at least one outer sidewall.

In any of the above methods, the fibrous preform can include an airfoil.

A tooling assembly suitable for use in infiltrating a fibrous preform comprises an outer tooling fixture having a plurality of outer sidewalls defining an inner volume, each of the plurality of outer sidewalls having an outer wall thickness, and a window extending through the outer wall thickness of at least one outer sidewall of the plurality of sidewalls. The tooling assembly further comprises an inner tooling fixture positioned within the inner volume of the outer tooling fixture, the inner tooling fixture having a plurality of inner sidewalls, each of the plurality of inner sidewalls having an inner wall thickness, and a plurality of holes extending through the inner wall thickness of at least one inner sidewall of the plurality of inner sidewalls. The at least one outer sidewall is positioned adjacent the at least one inner sidewall such that the window entirely overlaps with each hole of the plurality of holes in the at least one inner sidewall.

The tooling assembly of the preceding paragraph can optionally include, additionally and/or alternatively, any one or more of the following features, configurations and/or additional components:

In the above tooling assembly, the outer wall thickness and the inner wall thickness can combine to define a length of a straight flow path through the window and one of the plurality of holes.

In any of the above tooling assemblies, a gap can exist between the at least one outer sidewall and the at least one inner sidewall, and the gap can further define the length of the flow path.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A tooling assembly suitable for use in infiltrating a fibrous preform, the tooling assembly comprising:
   an outer tooling fixture formed from graphite and comprising:
      a plurality of outer sidewalls defining an inner volume, each of the plurality of outer sidewalls having an outer wall thickness; and
      a window extending through the outer wall thickness of at least one outer sidewall of the plurality of sidewalls; and
   an inner tooling fixture positioned within the inner volume of the outer tooling fixture, the inner tooling fixture formed from graphite and comprising:
      a plurality of inner sidewalls, each of the plurality of inner sidewalls having an inner wall thickness; and
      a plurality of holes extending through the inner wall thickness of at least one inner sidewall of the plurality of inner sidewalls;
   wherein the at least one outer sidewall is positioned adjacent the at least one inner sidewall such that the window overlaps with at least a subset of the plurality of holes in the at least one inner sidewall, the subset of the plurality of holes comprising multiple of the plurality of holes;
   wherein the outer wall thickness and the inner wall thickness combine to define a length of a straight flow path through the window and one hole of the subset of holes; and
   wherein the one hole of the subset of holes has a diameter, and wherein the window has a width greater than the diameter, such that the flow path is wider at the window than at the one hole, and such that the window is simultaneously aligned with all of the subset of the plurality of holes.

2. The tooling assembly of claim 1, wherein the outer tooling fixture comprises a window extending through the thickness of at least two outer sidewalls of the plurality of sidewalls.

3. The tooling assembly of claim 1, wherein the inner tooling fixture comprises a plurality of holes through the thickness of at least two inner sidewalls of the plurality of sidewalls.

4. The tooling assembly of claim 1, wherein a gap exists between the at least one outer sidewall and the at least one inner sidewall, and wherein the gap further defines the length of the flow path.

5. The tooling assembly of claim 1, wherein the inner tooling fixture is configured to retain a fibrous preform within the plurality of inner sidewalls.

6. The tooling assembly of claim 1, wherein each of the inner tooling fixture and the outer tooling fixture has a cuboidal geometry.

7. A method of arranging a fibrous preform in a tooling assembly for chemical vapor infiltration (CVI), the method comprising:
  securing the fibrous preform within an inner tooling fixture, the inner tooling fixture formed from graphite and comprising:
    a plurality of inner sidewalls, each of the plurality of inner sidewalls having an inner wall thickness; and
    a plurality of holes extending through the inner wall thickness of at least one inner sidewall of the plurality of inner sidewalls;
  placing the inner tooling fixture within an internal volume of an outer tooling fixture, the outer tooling fixture formed from graphite and comprising:
    a plurality of outer sidewalls defining the inner volume, each of the plurality of outer sidewalls having an outer wall thickness; and
    a window extending through the outer wall thickness of at least one outer sidewall of the plurality of sidewalls; and
  wherein placing the inner tooling fixture within the internal volume of the outer tooling fixture comprising:
    orienting the inner tooling fixture such that the window overlaps with at least a subset of the plurality of holes, the subset of the plurality of holes comprising multiple of the plurality of holes;
  wherein the outer wall thickness and the inner wall thickness combine to define a length of a straight flow path through the window and one hole of the subset of holes; and
  wherein the one hole of the subset of holes has a diameter, and wherein the window has a width greater than the diameter, such that the flow path is wider at the window than at the one hole, and such that the window is simultaneously aligned with all of the subset of the plurality of holes.

8. The method of claim 7 and further comprising: placing the outer tooling fixture and inner tooling fixture within a CVI reactor.

9. The method of claim 7, wherein securing the fibrous preform within the inner tooling fixture comprises clamping together multiple pieces of the inner tooling fixture around the fibrous preform.

10. The method of claim 7, wherein placing the inner tooling fixture within the internal volume of the outer tooling fixture comprises making the at least one inner sidewall flush with the at least one outer sidewall.

11. The method of claim 7, wherein placing the inner tooling fixture within the internal volume of the outer tooling fixture comprises leaving a gap between the at least one inner sidewall and the at least one outer sidewall.

12. The method of claim 7, wherein the fibrous preform comprises an airfoil.

13. A tooling assembly suitable for use in infiltrating a fibrous preform, the tooling assembly comprising:
  an outer tooling fixture formed from graphite and comprising:
    a plurality of outer sidewalls defining an inner volume, each of the plurality of outer sidewalls having an outer wall thickness; and
    a window extending through the outer wall thickness of at least one outer sidewall of the plurality of sidewalls; and
  an inner tooling fixture positioned within the inner volume of the outer tooling fixture, the inner tooling fixture formed from graphite and comprising:
    a plurality of inner sidewalls, each of the plurality of inner sidewalls having an inner wall thickness; and
    a plurality of holes extending through the inner wall thickness of at least one inner sidewall of the plurality of inner sidewalls;
  wherein the at least one outer sidewall is positioned adjacent the at least one inner sidewall such that the window entirely overlaps with each hole of the plurality of holes in the at least one inner sidewall;
  wherein the outer wall thickness and the inner wall thickness combine to define a length of a straight flow path through the window and one hole of the plurality of holes; and
  wherein the one hole of the plurality of holes has a diameter, and wherein the window has a width greater than the diameter, such that the flow path is wider at the window than at the one hole, and such that the window is simultaneously aligned with multiple of the plurality of holes.

14. The tooling assembly of claim 13, wherein a gap exists between the at least one outer sidewall and the at least one inner sidewall, and wherein the gap further defines the length of the flow path.

15. The tooling assembly of claim 13, wherein the outer tooling fixture comprises a window extending through the thickness of at least two outer sidewalls of the plurality of sidewalls.

16. The tooling assembly of claim 13, wherein the inner tooling fixture comprises a plurality of holes through the thickness of at least two inner sidewalls of the plurality of sidewalls.

17. The tooling assembly of claim 13, wherein the inner tooling fixture is configured to retain a fibrous preform within the plurality of inner sidewalls.

18. The tooling assembly of claim 13, wherein each of the inner tooling fixture and the outer tooling fixture has a cuboidal geometry.

* * * * *